(12) United States Patent
Wipiejewski

(10) Patent No.: US 6,829,282 B2
(45) Date of Patent: Dec. 7, 2004

(54) VERTICAL RESONATOR LASER DIODE CONTAINING COPLANAR ELECTRICAL CONNECTING CONTACTS

(75) Inventor: Torsten Wipiejewski, Santa Barbara, CA (US)

(73) Assignee: Infineon Technologies AG, Munich (DE)

( * ) Notice: Subject to any disclaimer, the term of this patent is extended or adjusted under 35 U.S.C. 154(b) by 252 days.

(21) Appl. No.: 10/244,636

(22) Filed: Sep. 16, 2002

(65) Prior Publication Data

US 2003/0039295 A1 Feb. 27, 2003

Related U.S. Application Data

(63) Continuation of application No. PCT/DE01/00981, filed on Mar. 14, 2001.

(30) Foreign Application Priority Data

Mar. 16, 2000 (DE) ............................. 100 12 869

(51) Int. Cl.[7] ............... H01S 3/08; H01S 5/00
(52) U.S. Cl. ............... 372/96; 372/43; 372/98
(58) Field of Search ................ 372/43–50, 92–99

(56) References Cited

U.S. PATENT DOCUMENTS

| 5,204,870 A | * | 4/1993 | Faist et al. ................. 372/45 |
| 5,637,511 A | | 6/1997 | Kurihara |
| 5,696,389 A | * | 12/1997 | Ishikawa et al. ............. 257/99 |
| 5,729,566 A | * | 3/1998 | Jewell |
| 6,317,446 B1 | * | 11/2001 | Wipiejewski ................. 372/46 |
| 2003/0127608 A1 | * | 7/2003 | Shields et al. ............ 250/493.1 |

FOREIGN PATENT DOCUMENTS

| DE | 198 13 727 A1 | 9/1999 |
| DE | 199 47 817 A1 | 11/2000 |
| EP | 0 926 786 A2 | 6/1999 |
| EP | 0 955 708 A2 | 11/1999 |

OTHER PUBLICATIONS

Numai, T. et al.: "Surface–Emitting Laser Operation In Vertical–To–Surface Transmission Electrophotonic Devices With A Vertical Cavity", Applied Physics Letters, No. 12, Mar. 25, 1991, pp. 1250–1252.
Dutta, A.K. et al.: "High–Speed VCSEL of Modulation Bandwidth Over 7.0 GHz And Its Application To 100m PCF Datalink", IEEE, vol. 16, No. 5, May 1998, pp. 870–875.
Zou, Z. et al.: "Ultralow–Threshold Cryogenic Vertical Cavity Surface–Emitting Laser", IEEE Transactions on Photonics Technology Letters, vol. 12, No. 1, Jan. 2000, pp. 1–3.

* cited by examiner

Primary Examiner—Minsun Oh Harvey
Assistant Examiner—Phillip Nguyen
(74) Attorney, Agent, or Firm—Laurence A. Greenberg; Werner H. Stemer; Ralph E. Locher

(57) ABSTRACT

A vertical resonator laser diode and a method for fabricating it are described. Electrical connecting contacts can be disposed on a common main surface of the laser diode, for example its light exit side. For this purpose, in the course of the fabrication method, a contact-making zone is produced by indiffusion of impurity atoms, by which zone that side of the pn junction which is remote from the main surface can be electrically conductively connected to the main surface and be provided with a corresponding connecting contact.

21 Claims, 2 Drawing Sheets

VERTICAL RESONATOR LASER DIODE CONTAINING COPLANAR ELECTRICAL CONNECTING CONTACTS

CROSS-REFERENCE TO RELATED APPLICATION

This application is a continuation of copending International Application No. PCT/DE01/00981, filed Mar. 14, 2001, which designated the United States and was not published in English.

BACKGROUND OF THE INVENTION

FIELD OF THE INVENTION

The present invention relates to a vertical resonator laser diode and a method for fabricating it. The invention thus relates to a vertical resonator laser diode (VCSEL) as has been described for example in Published, Non-Prosecuted German Patent Application DE 198 13 727 A1, corresponding to U.S. Pat. No. 6,317,446. In the VCSEL, an active layer sequence serving for the generation of laser radiation is disposed between a first Bragg reflector layer sequence and a second Bragg reflector layer sequence, each of which has a plurality of mirror pairs. The two Bragg reflector layer sequences form a laser resonator and are disposed together with the active layer sequence between a first and a second electrical connecting contact layer. One of the two Bragg reflector layer sequences is partially transmissive for the laser radiation generated in the active layer sequence, while the other of the two Bragg reflector layer sequences is highly reflective for the laser radiation generated in the active layer sequence.

Such vertical resonator laser diodes are increasingly of interest in the application in optical communications and data technology and also for signal systems or the like. The configuration described in Published, Non-Prosecuted German Patent Application DE 198 13 727 A1 has connecting contacts situated on opposite sides of the component. In the exemplary embodiment described therein, the anode contact layer is situated on the semiconductor surface on the light exit side, while the cathode connection is connected to the n-doped substrate. However, this construction restricts the usability of the VCSEL to an excessively great extent. For specific mounting techniques, such as flip-chip bonding or mounting on simple and inexpensive lead frames, a VCSEL configuration would be desirable in which the electrical connections for the anode and the cathode are situated on a common main surface of the component, for example on the top side of the chip.

SUMMARY OF THE INVENTION

It is accordingly an object of the invention to provide in a vertical resonator laser diode containing coplanar electrical connecting contacts which overcomes the above-mentioned disadvantages of the prior art devices of this general type, which enable a construction in which the electrical connecting contacts are disposed essentially in coplanar fashion on one and the same main surface of the component.

With the foregoing and other objects in view there is provided, in accordance with the invention, a vertical resonator laser diode. The laser diode contains a main surface, and two Bragg reflector sequences including a first Bragg reflector layer sequence having a plurality of mirror pairs and a second Bragg reflector layer sequence having a plurality of mirror pairs and defining part of the main surface. The two Bragg reflector layer sequences form a laser resonator. An active layer sequence is provided and has a pn junction and serves for generating laser radiation. The active layer sequence is disposed between the first Bragg reflector layer sequence and the second Bragg reflector layer sequence. A contact-making zone having a relatively high electrical conductivity and a surface defining part of the main surface, is provided. The contact-making zone extends from the main surface at least as far as the pn junction for making a conductive connection with the first Bragg reflector layer sequence. Two mutually insulated, electrical connection contacts are applied to the main surface. The two Bragg reflector layer sequences and the active layer sequence are disposed in a current path between the two mutually insulated, electrical connecting contacts. The two mutually insulated, electrical connection contacts include a first electrical connecting contact connected to the second Bragg reflector layer sequence, and a second electrical connecting contact disposed on the contact-making zone and coupled to the first Bragg reflector layer sequence though the contact-making zone. An insulation layer is provided for electrically insulating the contact-making zone from the second Bragg reflector layer sequence and from the active layer sequence.

With the foregoing and other objects in view there is further provided, in accordance with the invention, a method for fabricating a vertical resonator laser diode. The method includes the steps of:

a) providing a semiconductor substrate;

b) applying a first Bragg reflector layer sequence to the semiconductor substrate;

c) applying an active layer sequence having a pn junction to the first Bragg reflector layer sequence;

d) applying a second Bragg reflector layer sequence to the active layer sequence resulting in a formation of a laser resonator being formed by the first Bragg reflector layer sequence, the active layer sequence and the second Bragg reflector layer sequence;

e) forming a contact-making zone of relatively high electrical conductivity extending from a surface of the second Bragg reflector layer sequence at least as far as the pn junction;

f) forming an insulation zone serving for electrical insulation between the contact-making zone and the second Bragg reflector layer sequence and the active layer sequence; and g) applying electrical connecting contacts to a common main surface of the vertical resonator laser diode such that a first connecting contact is connected to the second Bragg reflector layer sequence and a second connecting contact is connected to the contact-making zone.

In this case, method steps e) and f) can be executed in the order specified above, but also, in principle, in the opposite order. In the latter case, first the insulation zone is produced between the second Bragg reflector layer sequence and a section provided as the contact-making zone, and then the contact-making zone is formed, in accordance with method step e), in the section provided therefor.

The insulation zone between the contact-making zone and the second Bragg reflector layer sequence can be fabricated, for example, by shaping a trench between the contact-making zone and one Bragg reflector layer sequence by vertical patterning, that is to say essentially by one or more etching steps, and filling the trench with an electrically insulating material.

In a preferred exemplary embodiment, however, not only is the trench shaped, but larger regions of the second Bragg reflector layer sequence and of the active layer sequence are removed by vertical patterning around a light-emitting region of the laser diode that is to be formed, so that the light-emitting region remains as a mesa-type structure. Before the removed regions are then filled with the electrically insulating material, current aperture layers can then be shaped using the free-standing mesa-type structure in a manner known per se (see Non-Prosecuted German Patent Application DE 198 13 727 A1). In the case of a laser diode based on III-V material, the layers can be fabricated by oxidizing layers with a relatively high aluminum content, as a result of which an oxidized, annular-and peripheral section adjoining the side walls of the mesa-type structure is formed in a manner dependent on the process conditions, the oxidation, the aluminum content and the thickness of the layer. The current aperture layer may be disposed within the first or the second Bragg reflector layer sequence. The width of the annular section, that is to say the diameter of the current conduction region, can also be set in a relatively targeted manner by the process conditions. After the fabrication of the one or the plurality of current aperture layers, the regions removed during the mesa etching can then be filled with the electrically insulating material.

If the intention is to fabricate a vertical resonator laser diode based on III-V material, it is possible, as early as during the growth of the layer structure, to grow layers with such a material composition either as intermediate layers between the mirror pairs or as partial layers of the mirror pairs in the first or the second Bragg reflector layer sequence, so that current aperture layers can be formed from them in a later process. In the case of a vertical resonator laser diode based on (Al, Ga) As, such layers which are provided as current aperture layers are shaped with a relatively high aluminum content.

The contact-making zone can be fabricated by impurity atoms being introduced into the component by diffusion or implantation. In the exemplary embodiment described below, these impurity atoms are introduced on the main surface of the component on the light exit side. They are intended to produce a relatively high electrical conductivity in the contact-making zone. The impurity atoms may thus be, for example, a dopant that produces a relatively high n-type or p-type doping in the second Bragg reflector layer sequence in the region of the contact-making zone to be produced. In the case of III-V material, by way of example, a doping with zinc atoms, that is to say a p-type doping, may be performed. The latter may be performed for example by diffusion at about 600° C.–650° C. In this case, it is also possible to bring about intermixing of the layers with a different Al content (disordering). This effect does not constitute a disadvantage for the function of the component, but rather provides for a contact-making zone with good electrical conductivity without disturbing heterointerfaces. Before the diffusion step is carried out, masking may be performed by depositing, for example, a masking layer, such as a $Si_3N_4$ layer, with a mask opening in the region of the contact-making zone to be shaped on the main surface of the component. The size and shape of the mask opening define the lateral boundary of the contact-making zone, while its depth is determined by the process conditions of the diffusion.

The introduction of impurity atoms with the aim of doping can alternatively also be carried out by an ion implantation. In this case, a mask layer, such as a $Si_3N_4$ mask layer, may likewise be used. The implantation can be carried out by a number of implantation steps with suitably chosen implantation energies and doses, so that a contact-making zone is fabricated with an electrical conductivity that is sufficiently homogeneous over its depth.

Other features which are considered as characteristic for the invention are set forth in the appended claims.

Although the invention is illustrated and described herein as embodied in a vertical resonator laser diode containing coplanar electrical connecting contacts, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
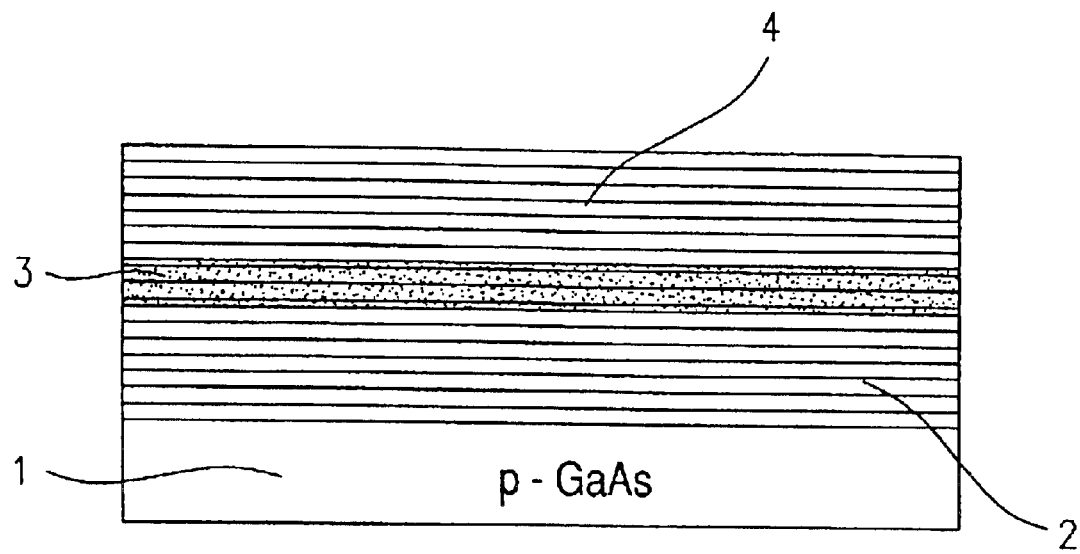
FIGS. 1A–1D are diagrammatic, sectional views of intermediate products stages for a fabrication process for fabricating a vertical resonator laser diode according to the invention.

Referring now to the figures of the drawing in detail and first, particularly, to FIG. 1A thereof, there is shown a layer structure on which a vertical resonator laser diode is based. First, a first, lower, p-doped Bragg reflector layer sequence 2 constructed from individual identical mirror pairs is grown on a p-doped GaAs substrate 1. The mirror pairs each contain two p-doped AlGaAs layers having a different band gap, i.e. different aluminum concentration, for example. An active layer sequence 3 having a pn junction, and having an active, light-emitting zone, is grown on a first Bragg reflector layer sequence 2. The zone may be an intrinsic zone of a pn junction formed from bulk semiconductor material. However, the active zone may also be formed from a single or multiple quantum well structure. The emission wavelength of the laser diode may be 850 nm, for example.

A second, upper, n-doped Bragg reflector layer sequence 4, which is constructed from individual identical mirror pairs in the same way as the first Bragg reflector layer sequence 2, is then applied to the active layer sequence 3.

The degree of reflection of the two Bragg reflector layer sequences is coordinated with the emission wavelength in a manner known per se by the choice of the layer thicknesses and/or material compositions of the mirror pairs in such a way that the first, lower Bragg reflector layer sequence 2 has a high degree of reflection, ideally 100%, while the second, upper Bragg reflector layer sequence 4 is partially transmissive in order that the emitted laser radiation can be coupled out.

The structure fabricated after these method steps is illustrated in FIG. 1A.

Figure 1B:
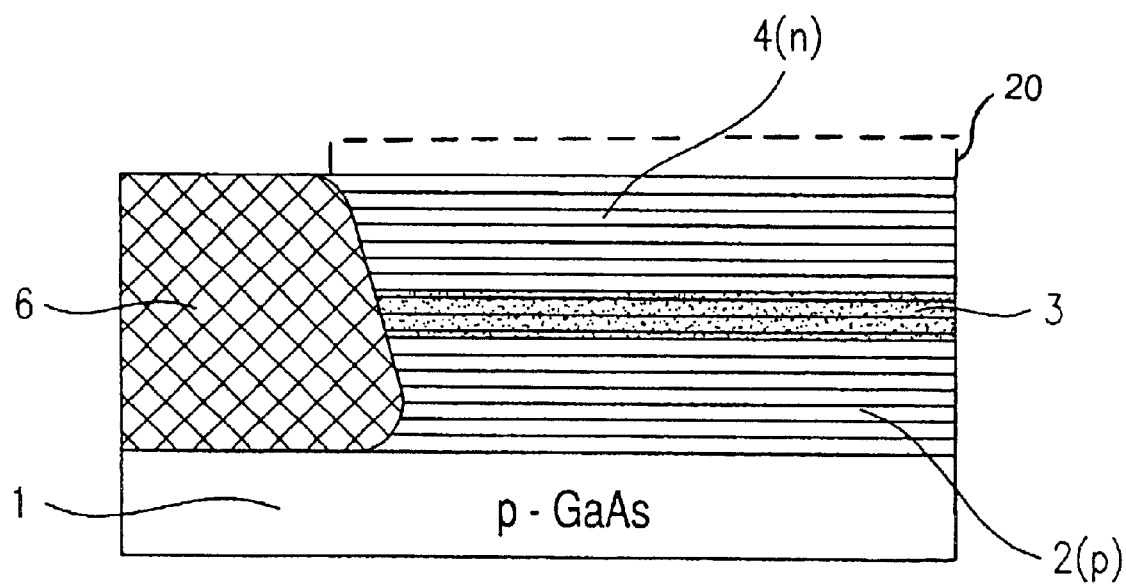

In the case of the present exemplary embodiment, the laser diode is intended to be electrically contact-connected by two electrical connecting contacts being applied in essentially coplanar fashion to its main surface on the light exit side, opposite to the substrate. Therefore, an electrically conductive connection is produced hereinafter between the p-type side of the pn junction and a main surface on the light exit side. This is achieved by introducing impurity atoms from the main surface on the light exit side by a diffusion process and thus producing an electrically conductive contact-making zone 6 (FIG. 1B). In the present case, by way of example, the species of impurity atoms can be chosen in such a way that the contact-making zone 6 becomes p-conducting. By way of example, zinc atoms can be diffused in a diffusion process at about 600° C.–650° C. In the region of the second Bragg reflector layer sequence 4, the introduction of p-conducting material constitutes a doping reversal or inversion of the semiconductor material, since the second Bragg reflector layer sequence 4 is originally n-doped. In the region of the first Bragg reflector layer sequence 2, by contrast, the p-doping already present there is intensified by the process. The contact-making zone 6 should be doped as heavily as possible in order, on the one hand, to obtain the highest possible electrical conductivity and in order, on the other hand, to obtain the greatest possible homogeneity of the contact-making zone 6, as a result of which the influence of the heterointerfaces originally present in this region is virtually caused to disappear.

Instead of a diffusion process, impurity substances can also be introduced by ion implantation. In order to obtain a sufficiently homogeneously doped zone in this case, it is preferable to carry out a plurality of implantation steps with different ion energies and doses. Afterward, a heat treatment process is carried out for annealing and for electrical activation of the implanted ions.

The contact-making zone 6 preferably extends as far as the substrate 1. This is not absolutely necessary, however. In order to shape a closed electric circuit, it suffices, in principle, if the contact-making zone 6 reaches as far as the pn junction.

Impurity atoms are preferably introduced through a mask 20 that covers the regions that are not to be doped. The mask 20 may be deposited for example in the form of an $Si_3N_4$ layer for a diffusion or a gold layer for an implantation on the surface, the mask layer having an opening which defines the lateral dimensions of the contact-making zone 6. After the impurity substance diffusion or implantation process has been carried out, the mask layer 20 is removed again. FIG. 1B illustrates the structure after the fabrication of the contact-making zone 6.

Figure 1C:
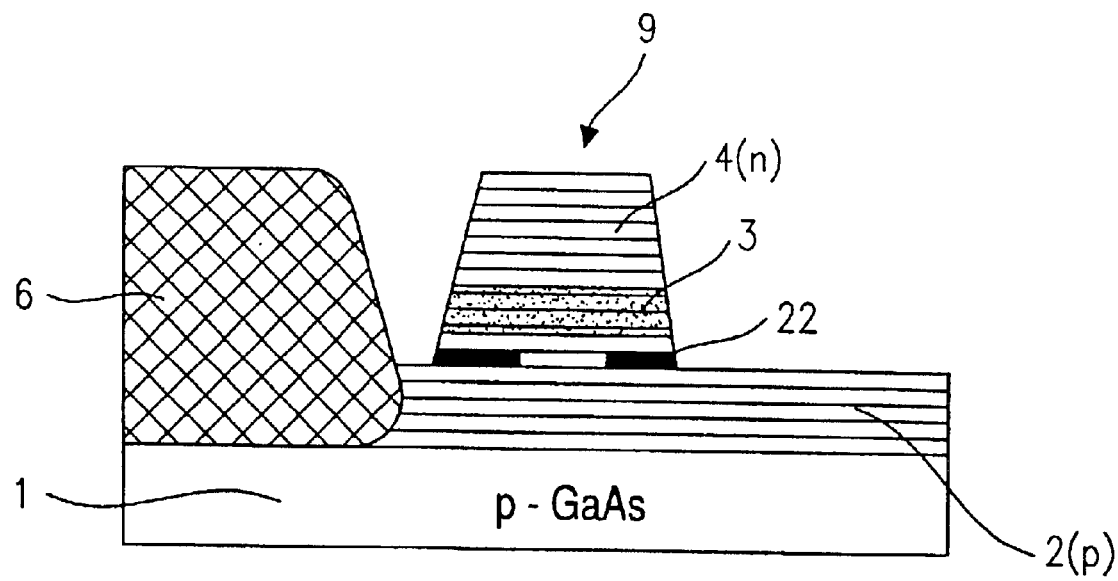

Afterward, in accordance with FIG. 1C, a mesa-type structure 9 is produced by an etching process, the structure 9 forming the light-emitting region of the laser diode. The mesa-type structure 9 may have for example a square or rectangular cross section, the side walls preferably being slightly beveled. The etching process is affected on all sides of the mesa-type structure 9 as far as a predetermined layer of the first Bragg reflector layer sequence 2. A current aperture layer 22 is subsequently fabricated by carrying out a selective oxidation of a layer—provided for this purpose—of the first Bragg reflector layer sequence 2 with a relatively high aluminum content. The selective oxidation can be carried out for example in a nitrogen atmosphere saturated with water vapor at approximately 400° C. The selectivity of the oxidation process is achieved by way of the greater aluminum content and/or a larger layer thickness (for the same aluminum content) than in the case of the other layers in the laser diode. The oxidation gives rise to an annular and peripheral, oxidization and thus an electrically insulating section adjoining the side walls of the mesa-type structure 9. This section concentrates the electric current in the laser diode, since it can only flow through the conduction region of the current aperture layer 22. The current concentration provides for particularly efficient operation of the laser diode. In this way, it is also possible to form a plurality of current aperture layers. In principle, the current aperture layer can also be disposed in the second Bragg reflector layer sequence 4 or in both Bragg reflector layer sequences. On account of the lower diffusion rate of charge carriers in the p-doped semiconductor, however, current concentration in the p-type region leads to more effective operation of the laser diode and is thus preferred.

The structure fabricated after these method steps is illustrated in FIG. 1C.

Figure 1D:
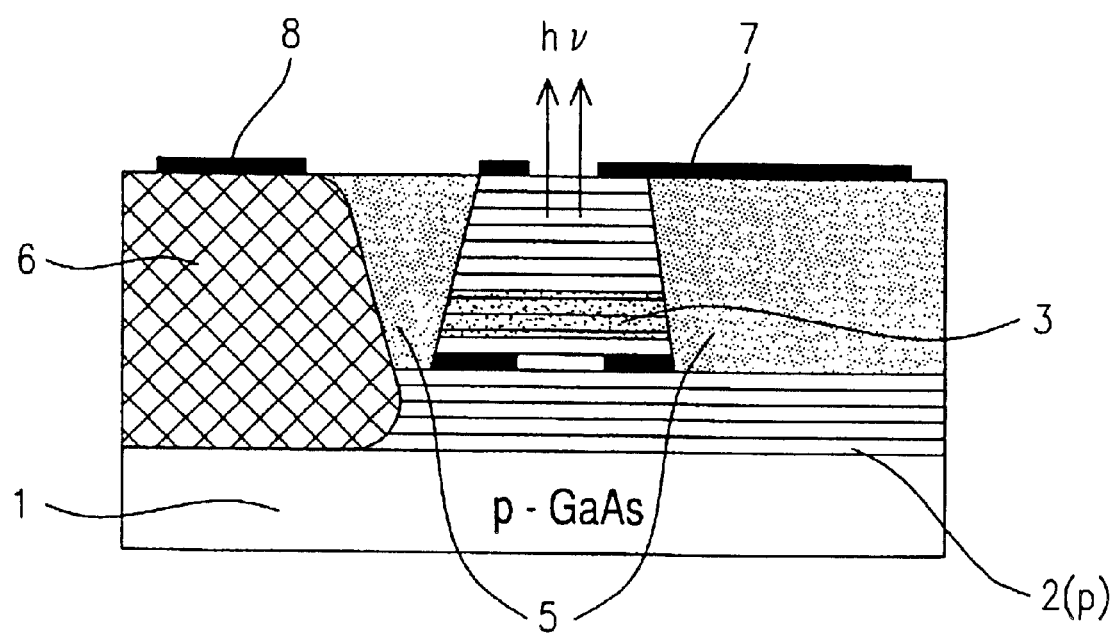

Afterward, regions removed by the etching steps are filled by an electrically insulating material, such as, for example, a plastic passivation layer 5. A first electrical connecting contact 7 with a light passage opening is then deposited on the second Bragg reflector layer sequence 4 and a second electrical connecting contact 8 is deposited on the contact-making zone 6. The first electrical connecting contact 7 may, as illustrated, bear partly on the passivation layer 5. The thus completed vertical resonator laser diode is illustrated in FIG. 1D.

Since an emission wavelength of 850 nm has been assumed, the light emission takes place toward the side remote from the substrate 1, since the GaAs substrate 1 is not transparent to this wavelength. For the case where other wavelengths are used, however, in contrast to the laser diode according to FIG. 1D, light emission toward the substrate side may be provided, so that the light exit side is opposite to the main surface occupied by the electrical connecting contacts.

Instead of the production of the mesa-type structure 9 as described in FIG. 1C, it is also possible to shape merely a trench between the contact-making zone 6 and a section that is spaced apart therefrom and is provided as the light-emitting region. The trench may subsequently be filled with an electrically insulating material.

In principle, the individual method steps of the exemplary embodiment may also be interchanged with one another in terms of their order. By way of example, the mesa etching and the filling of the etched-away regions can be carried out first and then the contact-making zone 6 can be formed by introduction of impurity atoms.

Theoretically, it is also conceivable to shape the insulation zone 5 between the contact-making zone 6 and the second Bragg reflector layer sequence 4 differently than by mesa etching and filling with an electrically insulating material. By way of example, it is possible to carry out an ion implantation with hydrogen ions having such a high dose that the semiconductor material is amorphized in the process. The implantation can also be effected merely in a trench-type section or be carried out around a mesa-type structure 9. In principle, a combined method is also conceivable, in which first a vertical etching down to a specific depth is carried out and then an amorphizing ion implantation down to an even greater depth is performed.

I claim:

1. A vertical resonator laser diode, comprising:
   a main surface;
   two Bragg reflector sequences including a first Bragg reflector layer sequence having a plurality of mirror pairs and a second Bragg reflector layer sequence having a plurality of mirror pairs and defining part of said main surface, said two Bragg reflector layer sequences forming a laser resonator;
   an active layer sequence having a pn junction and serving for generating laser radiation, said active layer sequence disposed between said first Bragg reflector layer sequence and said second Bragg reflector layer sequence;
   a contact-making zone having a relatively high electrical conductivity and a surface defining part of said main surface, said contact-making zone extending from said main surface at least as far as said pn junction for making a conductive connection with said first Bragg reflector layer sequence;

two mutually insulated, electrical connection contacts applied to said main surface, said two Bragg reflector layer sequences and said active layer sequence disposed in a current path between said two mutually insulated, electrical connecting contacts, said two mutually insulated, electrical connection contacts include a first electrical connecting contact connected to said second Bragg reflector layer sequence, and a second electrical connecting contact disposed on said contact-making zone and coupled to said first Bragg reflector layer sequence though said contact-making zone; and an insulation layer electrically insulating said contact-making zone from said second Bragg reflector layer sequence and from said active layer sequence.

2. The vertical resonator laser diode according to claim 1, wherein said insulation layer is fabricated by vertical patterning a trench formed between said contact-making zone and said second Bragg reflector layer sequence and by filling said trench with an electrically insulating material for forming the insulation layer.

3. The vertical resonator laser diode according to claim 2, wherein said second Bragg reflector layer sequence, said active layer sequence, and part of said first Bragg reflector layer sequence define a mesa-type structure having a light-emitting region, said meas-type structure being produced by vertical patterning and being spaced apart from said contact-making zone by said trench, and regions removed during the vertical patterning are filled with said electrically insulating material for forming said isolation region.

4. The vertical resonator laser diode according to claim 3, wherein at least one of said first and second Bragg reflector layer sequences forms, within said mesa-type structure, a current aperture layer, and said current aperture layer containing an oxidized annular and peripheral section adjoining sidewalls of said mesa-type structure.

5. The vertical resonator laser diode according to claim 1, wherein said insulation layer is fabricated by an ion implantation.

6. The vertical resonator laser diode according to claim 1, wherein the vertical resonator laser diode is fabricated on a basis of III-V semiconductor material.

7. The vertical resonator laser diode according to claim 4, wherein said current aperture layer has a relatively high aluminum content.

8. The vertical resonator laser diode according to claim 1, wherein said contact-making zone is fabricated by introducing impurity atoms.

9. The vertical resonator laser diode according to claim 8, wherein said impurity atoms are introduced by one of diffusion and implantation.

10. The vertical resonator laser diode according to claim 8, wherein:

said first Bragg reflector layer sequence and said contact-making zone are p-conducting and said second Bragg reflector layer sequence is n-conducting; and said impurity atoms are zinc atoms indiffused at a temperature of 600° C.–650° C. using a mask having a mask opening formed therein and said mask opening defines a lateral extent of said contact-making zone to be shaped.

11. The vertical resonator laser diode according to claim 10, wherein said mask is a $Si_3N_4$ mask layer.

12. A method for fabricating a vertical resonator laser diode, which comprises the steps of:

a) providing a semiconductor substrate;

b) applying a first Bragg reflector layer sequence to the semiconductor substrate;

c) applying an active layer sequence having a pn junction to the first Bragg reflector layer sequence;

d) applying a second Bragg reflector layer sequence to the active layer sequence resulting in a formation of a laser resonator being formed by the first Bragg reflector layer sequence, the active layer sequence and the second Bragg reflector layer sequence;

e) forming a contact-making zone of relatively high electrical nductivity extending from a surface of the second Bragg reflector layer sequence at least as far as the pn junction;

f) forming an insulation zone serving for electrical insulation between the contact-making zone and the second Bragg reflector layer sequence and the active layer sequence; and g) applying electrical connecting contacts to a common main surface of the vertical resonator laser diode such that a first connecting contact being connected to the second Bragg reflector layer sequence and a second connecting contact being connected to the contact-making zone.

13. The method according to claim 12, which comprises executing the steps in temporal order a), b), c), d), e), f) and g).

14. The method according to claim 12, which comprises executing the steps in temporal order a), b), c), d), f), e) and g); and performing step f) by producing the insulation zone between the second Bragg reflector layer sequence and the contact-making zone.

15. The method according to claim 12, which comprises performing step f) by:

shaping a trench between the contact-making zone and one of the first and second Bragg reflector layer sequences; and filling the trench with an electrically insulating material.

16. The method according to claim 15, which comprises performing step f) by:

producing a mesa-type structure spaced apart from the contact-making zone, by vertical patterning the first and second Bragg reflector layer sequences and the active layer sequence; and filling regions removed during the vertical patterning with the electrically insulating material.

17. The method according to claim 16, which comprises between the producing and filling steps, converting at least one of the first and second Bragg reflector layer sequences into a current aperture layer by carrying out an oxidation by which an annular and peripheral layer section adjoining the side walls of the mesa-type structure is continuously oxidized dependent on its composition and thickness and process conditions, and the oxidation proceeds from side walls of the mesa-type structure.

18. The method according to claim 12, which comprises fabricating the vertical resonator laser diode on a basis of III-V semiconductor material.

19. The method according to claim 18, which comprises fabricating one of the first and second Bragg reflector layer sequences, in which a current aperture layer is to be produced, with a relatively high aluminum content.

20. The method according to claim 19, which comprises introducing impurity atoms by one of diffusion and implantation for forming the contact-making zone during the step e).

21. The method according to claim 20, which comprises:
    forming the first Bragg reflector layer sequence to be p-conducting and the second Bragg reflector layer sequence to be n-conducting; and
    using zinc atoms as the impurity atoms so that the contact-making zone is formed as a p-conducting zone, the zinc atoms being indiffused at a temperature of 600° C.–650° C. and before the diffusion is carried out, applying an $Si_3N_4$ mask layer having a mask opening formed therein defining a lateral extent of the contact-making zone to be shaped.

* * * * *